United States Patent
Sato

(10) Patent No.: US 9,395,073 B2
(45) Date of Patent: Jul. 19, 2016

(54) COOLING UNIT AND ILLUMINATING APPARATUS

(71) Applicant: KOITO MANUFACTURING CO., LTD., Tokyo (JP)

(72) Inventor: Ryuho Sato, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 168 days.

(21) Appl. No.: 14/219,289

(22) Filed: Mar. 19, 2014

(65) Prior Publication Data

US 2014/0293625 A1 Oct. 2, 2014

(30) Foreign Application Priority Data

Mar. 26, 2013 (JP) .................. 2013-064525

(51) Int. Cl.
*F21V 29/02* (2006.01)
*F21S 8/10* (2006.01)
*H01L 23/467* (2006.01)
*F21V 29/78* (2015.01)
*F21S 8/02* (2006.01)
*F21Y 101/02* (2006.01)

(52) U.S. Cl.
CPC .............. *F21V 29/02* (2013.01); *F21S 48/321* (2013.01); *F21S 48/325* (2013.01); *F21V 29/78* (2015.01); *H01L 23/467* (2013.01); *F21S 8/02* (2013.01); *F21Y 2101/02* (2013.01); *H01L 2924/0002* (2013.01)

(58) Field of Classification Search
CPC ...... F21V 29/02; F21V 29/40; F21V 29/2212; F21V 29/74; F21K 9/135
USPC ...................... 165/122; 362/294, 373
See application file for complete search history.

(56) References Cited

U.S. PATENT DOCUMENTS

| | | | |
|---|---|---|---|
| 2011/0100600 A1* | 5/2011 | Tang | H01L 23/467 165/96 |
| 2011/0146960 A1* | 6/2011 | Cao | H01L 23/4093 165/121 |
| 2012/0168120 A1* | 7/2012 | Chang | F28F 9/002 165/67 |
| 2013/0170234 A1* | 7/2013 | Fang | F21K 9/135 362/373 |

FOREIGN PATENT DOCUMENTS

JP 2010003621 1/2010

* cited by examiner

*Primary Examiner* — Karabi Guharay
(74) *Attorney, Agent, or Firm* — Abelman, Frayne & Schwab

(57) ABSTRACT

Disclosed are a cooling unit including a blowing device and a heat sink, and an illuminating apparatus including the cooling unit, in which the assembling workability is improved. The blowing device has a frame configured to rotatably support a blower. The heat sink has an accommodating portion. The blowing device is displaceable between a first position at which the blower is disposed outside the accommodating portion, and a second position at which the blower is accommodated in the accommodating portion by the frame pivotably supported outside the accommodating portion.

6 Claims, 5 Drawing Sheets

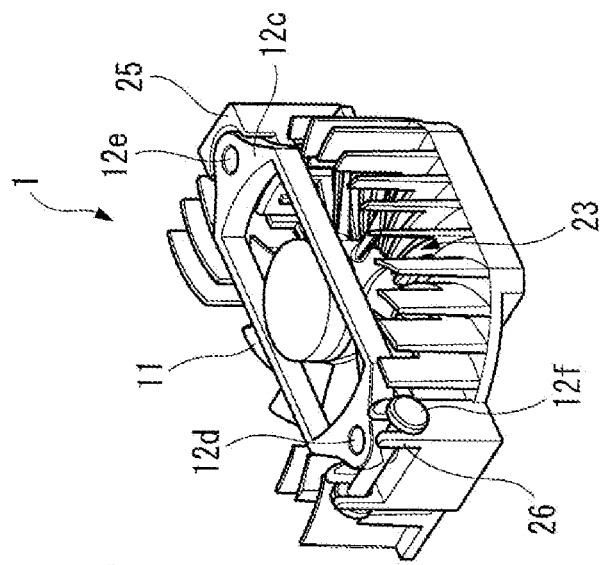
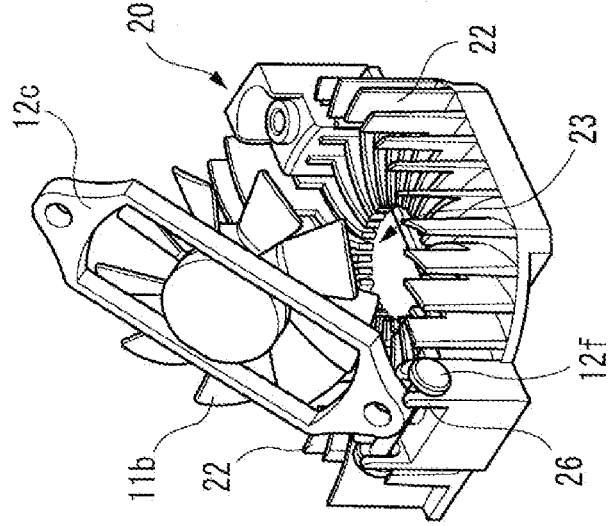
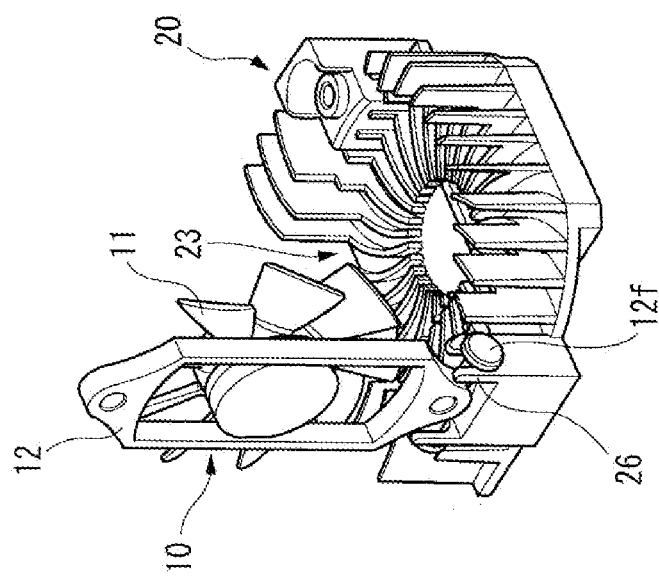

COOLING UNIT AND ILLUMINATING APPARATUS

CROSS-REFERENCE TO RELATED APPLICATIONS

This application is based on and claims priority from Japanese Patent Application No. 2013-064525, filed on Mar. 26, 2013 with the Japan Patent Office, the disclosure of which is incorporated herein in its entirety by reference.

TECHNICAL FIELD

The present disclosure relates to a cooling unit that includes a heat sink and a blowing device. Further, the present disclosure relates to an illuminating apparatus that includes the cooling unit.

BACKGROUND

In a cooling unit known in the related art, an accommodating portion is partitioned and formed in a part of a heat sink, and a rotatable blower is arranged in the accommodating portion (see, e.g., Japanese Patent Laid-Open Publication No. 2010-3621).

SUMMARY

When assembling a cooling unit as described above, a process of disposing a blower in the accommodating portion requires caful attention. If a wall partitioning and forming the accommodating portion or an operator's hand comes in contact with blades of the blower, a bearing structure of the blower may be damaged. Accordingly, deterioration of workability is unavoidable in the process.

Accordingly, an object of the present disclosure is to provide a technicque capable of enhancing assembly workability of a cooling unit provided with a heat sink and a blower, or an illuminating apparatus.

In order to achieve the above-mentioned object, the present disclosure according to a first aspect provides a cooling unit including a blowing device having a frame configured to rotatably support a blower; and a heat sink having an accommodating portion. The frame is pivotably supported outside the accommodating portion. Thus, the blowing device is displaceable between a first position at which the blower is disposed outside the accommodating portion and a second position at which the blower is accommodated in the accommodating portion.

In order to achieve the above-mentioned object, the present disclosure according to a second aspect provides an illuminating apparatus including a semiconductor light emitting element; a light transmitting member configured to transmit a light emitted from the semiconductor light emitting element; a heat sink disposed in the vicinity of the semiconductor light emitting element and having an accommodating portion; and a blowing device having a frame configured to rotatably support a blower. The frame is pivotably supported outside the accommodating portion. Thus, the blowing device is displaceable between a first position at which the blower is disposed outside the accommodating portion and a second position at which the blower is accommodated in the accommodating portion.

According to the above-mentioned configuration, an operator may engage a part of the blowing device with a part of the heat sink to form a pivot axis, and just pivot the blowing device on the pivot axis to accommodate the blower.

The blower may be configured to have a plurality of blades that extend radially from a central portion. In this case, the frame includes a first support that rotatably supports the central portion, a second support that extends from the first support, and a first axis forming member provided in the second support at a position that faces away from the plurality of blades when viewed from a rotation axis of the central portion. The heat sink includes a second axis forming member that is engaged with the first axis forming member to form a pivot axis. The blowing device is pivotable around the pivot axis between the first position and the second position.

According to the above-mentioned configuration, the periphery of the accommodating portion does not come in contact with the blades of the blower during the pivot operation. The operator does not have to pay attention to the contact between the accommodating portion and the blades, and thus, the assembly workability may be improved. Further, it is possible to suppress the performance deterioration caused when the bearing structure of the blower is damaged.

The blowing device may be configured to have a third support that extends from the first support in a direction different from the extension direction of the second support. Here, the third support extends to a position that faces away from the plurality of blades when viewed from the rotation axis.

According to the above-mentioned configuration, the operator may grasp the third support to pivot the blower. Therefore, the operator's hand will not be able to touch the blades during the pivot operation. As a result, the bearing structure of the blower may be securely suppressed from being damaged by touching the blades.

The first axis forming member may be configured to be a shaft that extends in a direction of the pivot axis. In this case, the second axis forming member is a bearing having a groove into which the shaft is inserted. According to the above-mentioned configuration, cost for molding the heat sink may be reduced.

The above-described summary is illustration purposes only and does not intend to limit in any ways. In addition to the illustrative embodiment, examples, and features described above, additional embodiment, example, and features will become apparent by referring to the drawings and the following detailed description.

BRIEF DESCRIPTION OF THE DRAWINGS

FIGS. 2A to 2C are views for explaining an assembly method of the cooling unit.

DETAILED DESCRIPTION

In the following detailed description, reference is made to the accompanying drawing, which form a part hereof The illustrative embodiments described in the detailed description, drawing, and claims are not meant to be limiting. Other embodiments may be utilized, and other changes may be made, without departing from the spirit or scope of the subject matter presented here.

Hereinafter, an exemplary embodiment according to the present disclosure will be described in detail with reference to the accompanying drawings. Further, in each drawing used in the following description, each member is appropriately changed in scale to a recognizable size.

Figure 1:
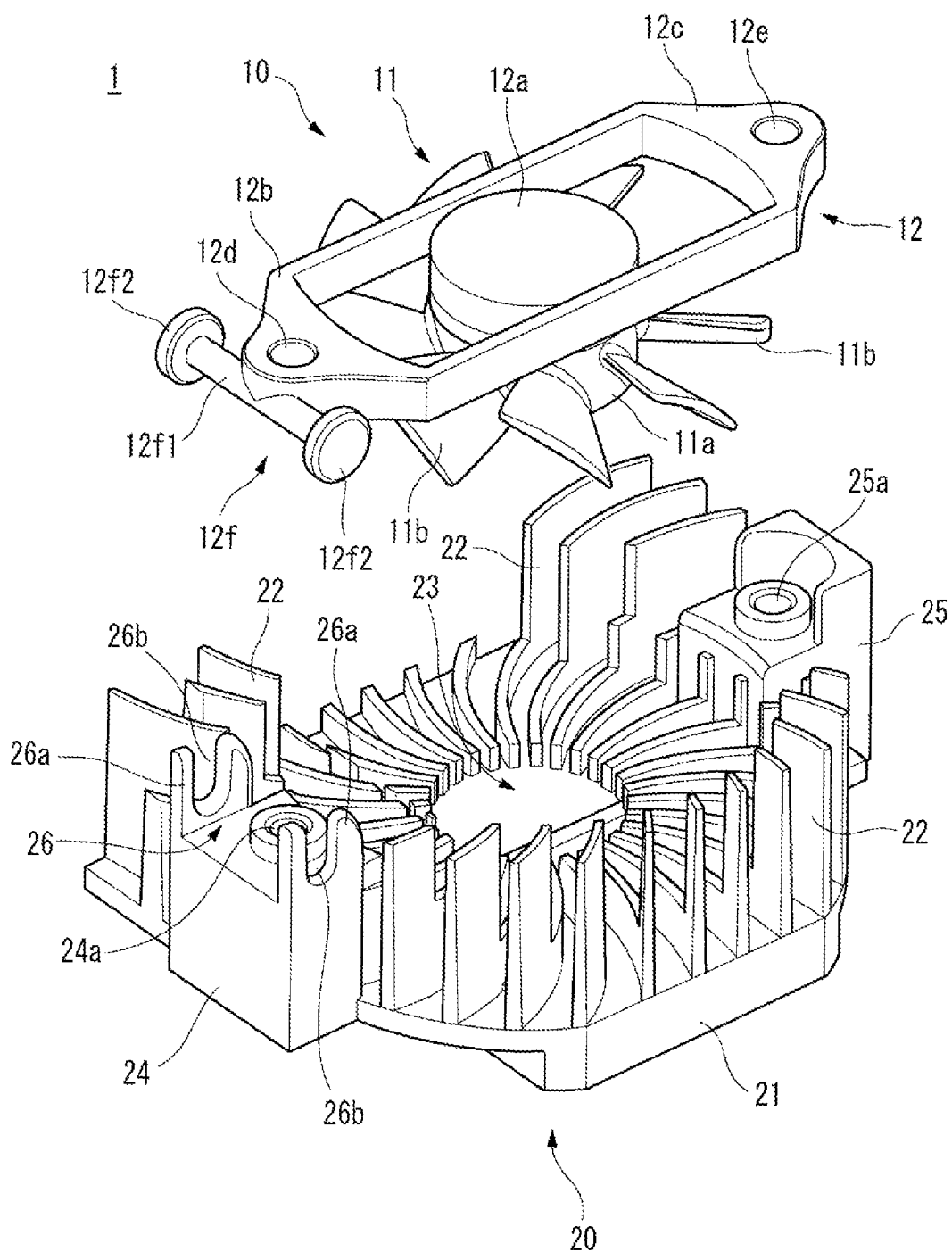
FIG. 1 is an exploded perspective view illustrating a cooling unit according to an exemplary embodiment of the present disclosure.

FIG. 1 is an exploded perspective view illustrating a cooling unit 1 according to an exemplary embodiment of the present disclosure. The cooling unit 1 is provided with a blowing device 10. The blowing device 10 is provided with a blower 11 and a frame 12. The frame 12 rotatably supports the blower 11.

The blower 11 has a plurality of blades 11b that extend radially from a central portion 11a. The frame 12 is provided with a first support 12a that rotatably supports the central portion 11a.

The frame 12 is provided with a second support 12b. The second support 12b has a pair of arms that extend from the first support 12a. The pair of arms are formed integrally at a tip end of the second support 12b, and the tip end is formed with an inserting hole 12d.

The frame 12 is provided with a third support 12c. The third support 12c has a pair of arms that extend from the first support 12a in a direction different from the extension direction of the second support 12b. The pair of arms extend to a position that faces away from the plurality of blades 11b when viewed from a rotation axis of the central portion 11a, and are formed integrally at a tip end of the third support 12c. The tip end is formed with an inserting hole 12e.

The frame 12 is provided with a shaft 12f. The shaft 12f is installed at the tip end of the second support 12b. More specifically, the shaft 12f is installed at a position that faces away from the blades 11b when viewed from the rotation axis of the central portion 11a of the blower 11.

The shaft 12f is provided with a shaft portion 12f1 and a pair of disc portions 12f2. The pair of disc portions 12f2 are installed at both axial ends of the shaft portion 12f1. The diameter of each of the disc portions 12f2 is larger than that of the shaft portion 12f1.

The cooling unit 1 is provided with a heat sink 20. The heat sink 20 is provided with a base 21, a plurality of heat radiation plates 22, and an accommodating portion 23.

The base 21 and the heat radiation plates 22 are made of a material having high thermal conductivity. The heat radiation plates 22 extend from the base 21. The accommodating portion 23 is a space partitioned and formed by being surrounded by the heat radiation plates 22.

The heat sink 20 is provided with a first fixing portion 24 and a second fixing portion 25. The first fixing portion 24 is provided outside the accommodating portion 23 in the base 21. The first fixing portion 24 is formed with a screw hole 24a. The second fixing portion 25 is provided outside the accommodating portion 23 in the base 21 and also opposite to the first fixing portion 24 across the accommodating portion 23. The second fixing portion 25 is formed with a screw hole 25a.

The heat sink 20 is provided with a bearing 26. The bearing 26 is provided with a pair of bearing pieces 26a in the first fixing portion 24. The screw hole 24a is disposed between the pair of bearing pieces 26a. Each of the bearing pieces 26a is formed with a bearing groove 26b.

Descriptions will be made on a method of assembling the blowing device 10 having the above-mentioned configuration to the heat sink 20 with reference to FIGS. 2A to 2C.

First, as illustrated in FIG. 2A, the shaft 12f of the blowing device 10 is engaged with the bearing 26 of the heat sink 20.

Specifically, the shaft portion 12f1 of the shaft 12f is inserted into the bearing groove 26b of the bearing 26. Accordingly, the frame 12 of the blowing device 10 is pivotably supported by the bearing 26 at the outside of the accommodating portion 23 of the heat sink 20. In other words, a pivot axis is formed by the shaft 12f (an example of the first axis forming member) and a bearing 26 (an example of the second axis forming member).

At this time, the respective inner surfaces of the disc portions 12f2 of the shaft 12f come in contact with the corresponding outer surfaces of the bearing pieces 26a, and restrain axial displacement of the shaft portion 12f1.

Next, as illustrated in FIG. 2B, the blowing device 10 is pivoted on the pivot axis formed as described above. As illustrated in FIG. 2C, the tip end of the third support 12c comes in contact with the second fixing portion 25 of the heat sink 20, and the pivot operation is terminated.

At this time, the blower 11 of the blowing device 10 is accommodated in the accommodating portion 23 of the heat sink 20. Further, the inserting holes 12d, 12e are disposed to face the screw hole 24a of the first fixing portion 24 and the screw hole 25a of the second fixing portion 25, respectively.

That is, the blowing device 10 is displaceable between a position as illustrated in FIG. 2A at which the blower 11 is disposed outside the accommodating portion 23 (an example of the first position), and a position as illustrated in FIG. 2C at which the blower 11 is accommodated in the accommodating portion 23 (an example of the second position) by the frame 12 pivotably supported outside the accommodating portion 23.

The blowing device 10 is fixed to the heat sink 20 by inserting screws (not illustrated) into the screw holes 24a, 25a through the inserting holes 12d, 12e. Accordingly, the cooling unit 1 is completed.

Heat from a heating element is conducted to the heat radiation plates 22 through the base 21. When the blower 11 is rotated, an air flow for cooling is generated. The air flow flows into the accommodating portion 23 along the direction of the rotation axis, and flows out of the accommodating portion 23 through gaps formed between the heat radiation plates 22. The heat emitted from the heat radiation plate 22 is exhausted to the outside of the cooling unit 1 together with the air flow.

According to the cooling unit having the above-mentioned configuration, an operator may accommodate the blower 11 in the accommodating portion 23 just by engaging a part (shaft 12f) of the blowing device 10 with a part (bearing 26) of the heat sink 20 to form a pivot axis, and pivoting the blowing device 10 on the pivot axis.

The position at which the shaft 12f is installed is a a position that faces away from the blades 11b when viewed from the rotation axis of the blowing device 11 in the second support 12b, and the position at which the bearing 26 is provided is outside the accommodating portion 23. That is, the position at which the pivot axis is formed is outside the accommodating portion 23. Further, the heat radiation plates 22 portioning and forming the accommodating portion 23 are positioned outside the movement trajectory of the blower 11 when the blowing device 10 is pivoted.

Accordingly, the heat radiation plates 22 do not come in contact with the blades 11b of the blower 11 during the pivoting operation. The operator does not have to pay attention to the contact between the heat radiation plates 22 and the blades 11b, and thus, the assembly workability may be improved. Further, it is possible to suppress the performance deterioration caused when the bearing structure of the blower 11 is damaged.

The third support 12c extends in a direction different from the extension direction of the second supporting portion to a position that faces away from the blades 11b when viewed from the rotation axis of the blowing device 11. Accordingly, since the operator may grasp the tip end (a position at which the inserting hole 123 is formed) of the third support 12c to pivot the blowing device 10, the operator's hand does not touch the blades 11b during the pivot operation. As a result, it may be ensured that damage to the bearing structure of the blower 11 by touching the blades may be suppressed.

When the shaft 12f is engaged with the bearing 26, the inner surfaces of the disc portions 12f2 of the shaft 12f having a greater width than that of the bearing grooves 26b come in contact with the corresponding outer surfaces of the bearing pieces 26a, respectively, and restrain the axial displacement of the shaft portion 12f1. As a result, the position of the frame 12 in the pivot axis direction is restrained during the pivot operation. Therefore, the blower 11 may be suppressed from coming in contact with the heat radiation plates 22.

Figure 3A:
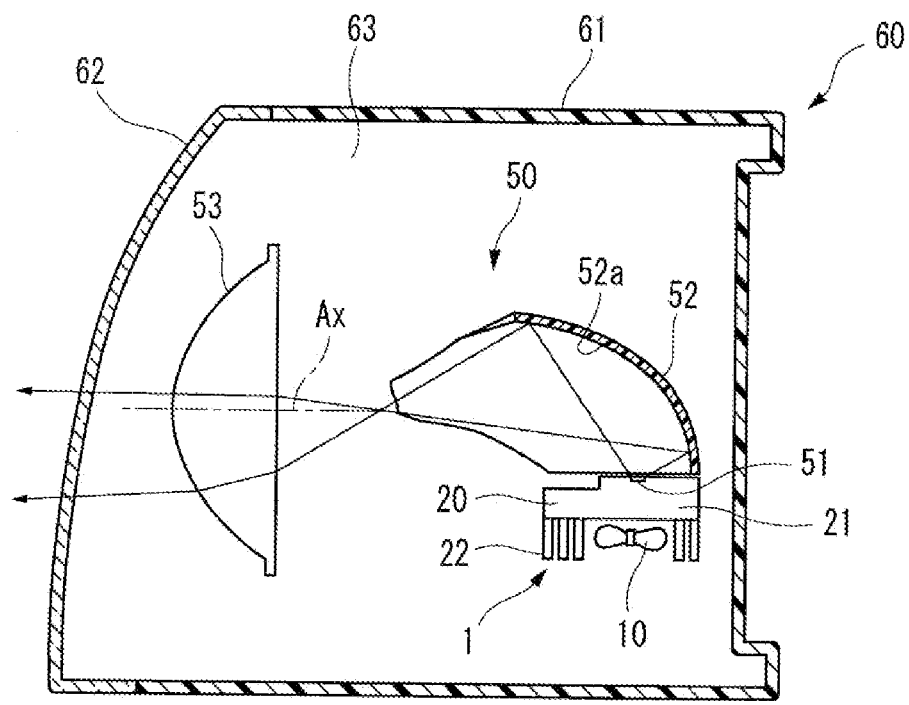
FIGS. 3A and 3B are schematic views exemplifying a configuration of an illuminating apparatus provided with the cooling unit.

FIG. 3A schematically illustrates a configuration of a lamp 50 mounted on a vehicle, as an example of an illuminating apparatus provided with the cooling unit 1 as described above. The lamp 50 is provided with a semiconductor light emitting element 51, a reflector 52, and a lens 53.

The lamp 50 is equipped in, for example, a headlamp device 60. In the headlamp device 60, a light transmitting cover 62 is installed on a housing 61 to partition and form a lamp chamber 63. The lamp 50 is disposed in the lamp chamber 63.

The semiconductor light emitting element 51 is supported on the base 21 of the heat sink 20 included in the cooling unit 1. As the semiconductor light emitting element 51, a light emitting diode, a laser diode, and an organic EL device may be exemplified.

The reflector 52 has a reflective surface 52a based on a spheroidal shape. The light reflected by the reflective surface 52a travels towards the lens 53.

The lens 53 (an example of the light transmitting member) transmits a light emitted from the semiconductor light emitting element 51 and reflected by the reflector 52. The symbol Ax represents an optical axis of the lens 53. The light that has passed through the lens 53 illuminates the front of the lamp 50 through the light transmitting cover 62 while forming a predetermined light distribution pattern.

The heat accompanying the light emission of the semiconductor light emitting element 51 is transmitted to the heat radiation plates 22 through the base 21 of the heat sink 20. The heat emitted from the heat radiation plates 22 is exhausted outside the cooling unit 1 by the air flow generated by the rotation of the blower 11 of the blowing device 10.

Figure 3B:
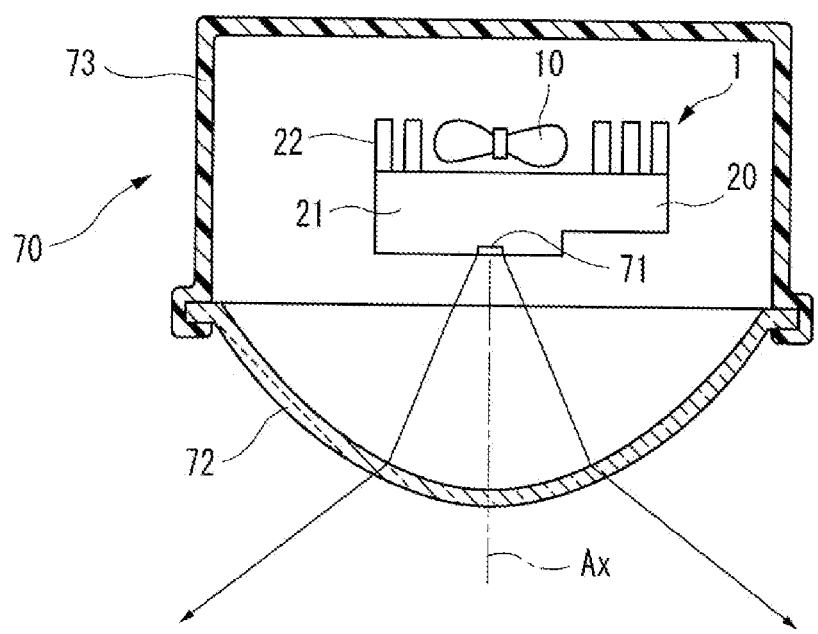

FIG. 3B schematically illustrates a configuration of an illuminator 70 which is installed on a wall or ceiling of a house, as another example of the illuminating apparatus provided with the cooling unit 1 as described above. The illuminator 70 is provided with a semiconductor light emitting element 71, a diffusion lens 72, and a housing 73. The diffusion lens 72 is installed on the housing 73 to partition and form a space accommodating the seminconductor light emitting element 71.

The semiconductor light emitting element 71 is supported on the base 21 of the heat sink 20 included in the cooling unit 1. As the semiconductor light emitting element 71, a light emitting diode, a laser diode, and an organic EL may be exemplified.

The diffusion lens 72 (an example of the light transmitting member) has, for example, a milky white appearance because small light reflectors are dispersed in a light transmitting material of the diffusion lens 72. The light emitted from the semiconductor light transmitting element 71 passes through the diffusion lens 72 at a predetermined diffusion angle to illuminate the front of the illuminator 70.

The heat accompanying the light emission of the semiconductor light emitting element 71 is transmitted to the heat radiation plates 22 through the base 21 of the heat sink 20. The heat emitted from the heat radiation plates 22 is exhausted outside the cooling unit 1 by the air flow generated by the rotation of the blower 11 of the blowing device 10.

The above-mentioned exemplary embodiments are given for the purpose of facilitate the understanding of the present disclosure, and are not intended to limit the present disclosure. It is appararent that the present disclosure may be modified without departing from the spirit, and its equivalents are included in the present disclosure.

In the above-mentioned exemplary embodiments, the accommodating portion 23 is partitioned and formed by the heat radiation plates 22. Since the heat radiation plates 22, which are essential components for the heat sink 20, are used for forming the accommodating portion 23, it is possible to reduce the size of the heat sink 20 as well as to enhance the circulation efficiency of the air flow generated by the rotation of the blower 11.

However, the accommodating portion 23 is not necessarily partitioned and formed by the heat radiation plates 22. As long as the blower 11 of the blowing device 10 is accommodated, a recess formed on a part of the heat sink 20 may be formed as the accommodating portion 23.

Figure 4:
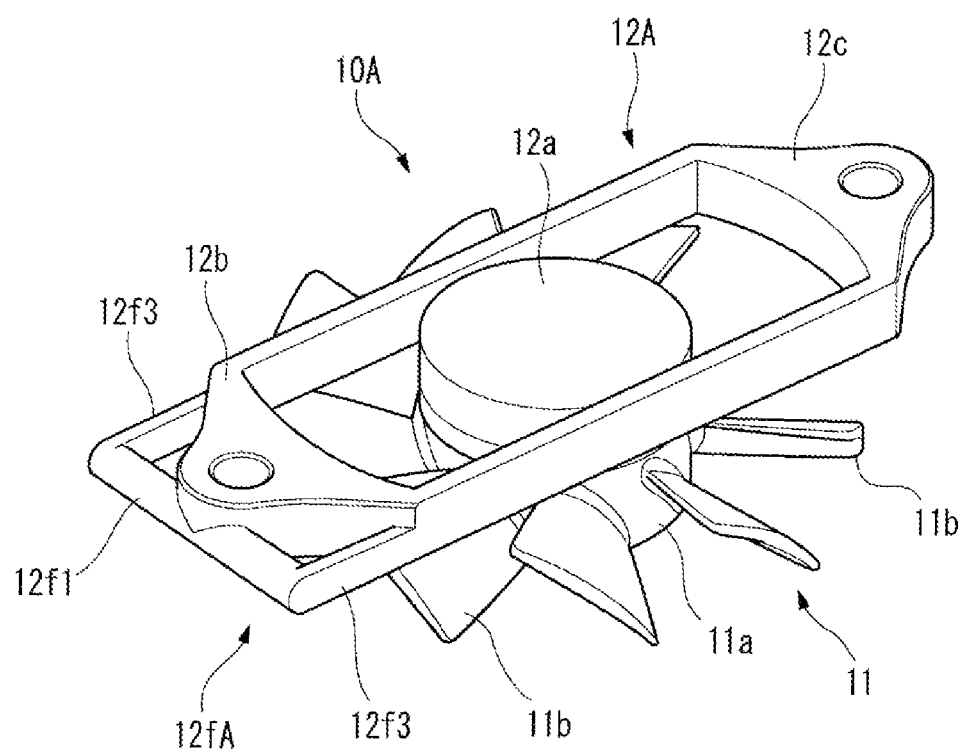
FIG. 4 is a perspective view illustrating a modified embodiment of a blowing device in the cooling unit.

The pair of disc portions 12f2 are not necessarily provided on the shaft 12f. For example, like a shaft 12fA provided in a blowing device 10A according to a modified embodiment illustrated in FIG. 4, a pair of arms 12f3 may be formed to connect both axial ends of a shaft portion 12f1 and a pair of arms of the second support 12b.

When the shaft 12fA is engaged with the bearing 26 of the heat sink 20, the inner surfaces of the arms 12f3 come in contact with the outer surfaces of bearing pieces 26a of the bearing 26, respectively, and restrain the axial displacement of the shaft portion 12f1. As a result, the position of the pivot axis direction of a frame 12A is restrained during the pivot operation of the blowing device 10A. Therefore, the blower 11 may be suppressed from coming in contact with heat radiation plates 22. Further, since the shaft portion 12f1 and the second support 12b are formed integrally, the rigidity of the frame 12A may be enhanced. Therefore, deformation or damage due to stress caused by the pivot operation may be prevented.

In the above-mentioned exemplary embodiment, the pivot axis of the blowing device 10 is formed by the shaft 12f provided in the blowing device 10 and the bearing 26 provided in the heat sink 20. According to the configuration, molding costs of the heat sink 20 may be reduced. Specifically, when the direction of the bearing groove 26b is consistent with the extension direction of the heat radiation plates 22, the reduction effect becomes remarkable.

Figure 5:
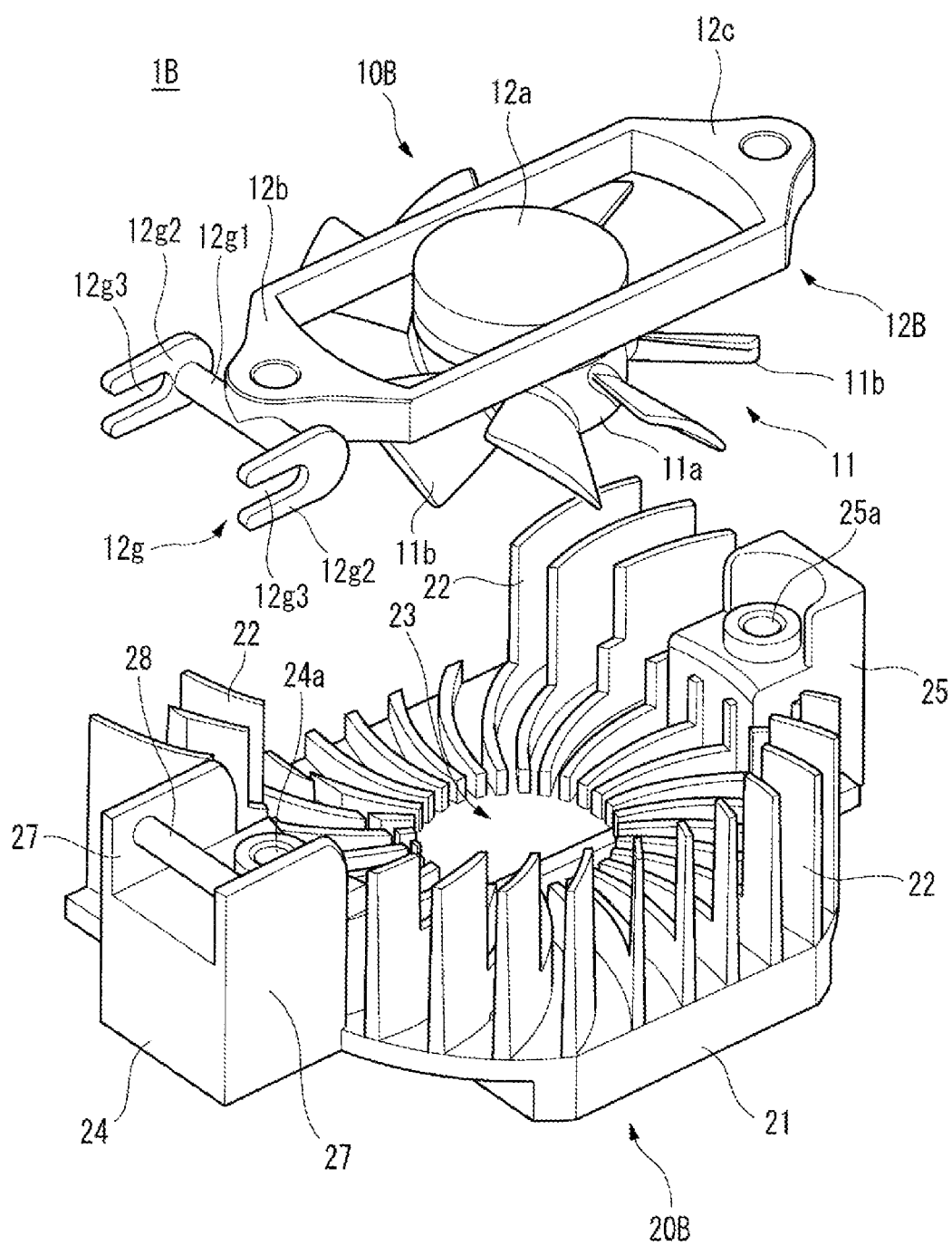
FIG. 5 is an exploded perspective view illustrating a modified embodiment of the cooling unit.

However, the relationship of the shaft and bearing forming the pivot axis may be reversed. FIG. 5 illustrates a cooling unit 1B according to such a modified embodiment. The same numeral references are given to substantially the same components as in the cooling unit 1 according to the above-mentioned exemplary embodiment, and the repeated description is omitted.

In a frame 12B of a blowing device 10B, a bearing 12g (an example of the first axis forming member) is provided at the tip end of a second support 12b. The bearing 12g is provided with a shaft portion 12g1 that extends in a direction orthogonal to the extension direction of the second support 12b. Bearing pieces 12g2 are provided at both axial ends of the shaft portion 12g1, respectively. Each of the bearing pieces 12g2 is formed with a bearing groove 12g3.

A first fixing portion 24 of a heat sink 20B is formed with a pair of walls 27, and a shaft 28 (an example of the second axis forming member) extends to connect the pair of walls 27. The blowing device 10B is engaged with the shaft 28 in the posture as illustrated in FIG. 2A to form a pivot axis. Specifically, the shaft 28 is inserted into the respective bearing groove 12g3. At this time, the outer surfaces of the bearing pieces 12g2 come in contact with the respective inner surfaces of the walls 27, respectively, and restrain the axial displacement of the shaft portion 12g1.

Similar to the case as illustrated in FIGS. 2B and 2C, a blower 11 is accommodated in an accommodating portion 23 of the heat sink 20B by pivoting the blowing device 10B on the pivot axis formed as described above.

A position of the second fixing portion 25 of the heat sink 20 (20B) is not limited to the position facing the first fixing portion 24 across the accommodating portion 23. As long as the blowing device 10 (10A, 10B) is fixed in a state where the blower 11 is accommodated in the accommodating portion 23, the second fixing portion 25 may be disposed at a proper place outside the accommodating portion 23 depending on, for example, the layout of the heat radiation plates 22. The extension direction of the third support 12c of the frame 12 is changed depending on the position of the second fixing portion 25.

In the lamp 50, as long as the light emitted from the semiconductor element 51 passes through the lens 53, the existence, the arrangement, and the shape of the reflector 52 are optional. For example, a parabolic optical system or a monofocus optical system using a reflector having a reflective surface based on a paraboloidal shape, may be adopted.

In the illuminator 70, as long as a predetermined light distribution is capable of being performed using the light emitted from the semiconductor light emitting element 71, the lens 72 may be replaced with an appropriate optical component (e.g., a simple light transmitting member, a light guide member, or a diffusion filter).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cooling unit comprising:
   a blowing device having a frame configured to rotatably support a blower including plurality of blades; and
   a heat sink having a central recess portion configured to accommodate the plurality of blades of the blower within the central recess portion and a plurality of heat radiation plates provided to surround the central recess portion,
   wherein the frame of the blowing device is pivotably supported by an engaging element of the heat sink provided outside the central recess portion such that the plurality of blades of the blower of the blowing device are pivotably displaceable between a first position at which the plurality of blades of the blower are disposed outside the central recess portion and a second position at which the plurality of blades of the blower are accommodated within the central recess portion.

2. The cooling unit according to claim 1, wherein the blower includes a plurality of blades that extend radially from a central portion,
   the frame includes a first support that rotatably supports the central portion, a second support that extends from the first support, and a first axis forming member provided in the second support at a position that faces away from the plurality of blades when viewed from a rotation axis of the central portion,
   the heat sink includes a second axis forming member that is engaged with the first axis forming member to form a pivot axis, and
   the blowing device is configured to be pivotabe around the pivot axis between the first position and the second position.

3. The cooling unit according to claim 2, wherein the blowing device includes a third support that extends from the first support in a direction different from the extension direction of the second support, and
   the third support extends to a position that faces away from the plurality of blades when viewed from a rotation axis of the central portion.

4. The cooling unit according to claim 3, wherein the first axis forming member is a shaft that extends in a direction of the pivot axis, and
   the second axis forming member is a bearing having a groove into which the shaft is inserted.

5. The cooling unit according to claim 2, wherein the first axis forming member is a shaft that extends in a direction of the pivot axis, and
   the second axis forming member is a bearing having a groove into which the shaft is inserted.

6. An illuminating apparatus comprising:
   a semiconductor light emitting element;
   a light transmitting member configured to transmit a light emitted from the semiconductor light emitting element;
   a blowing device having a frame configured to rotatably support a blower including a plurality of blades; and
   having a central recess portion configured to accommodate the plurality of blades of the blower within the central recess portion and a plurality of heat radiation plates provided to surround the central recess portion:
   wherein the frame of the blowing device is pivotably supported by an engaging element of the heat sink provided outside the central recess portion such that the plurality of blades of the blower of the blowing device are displaceable between a first position at which the plurality of blades of the blower are disposed outside the central recess portion, and a second position at which the plurality of blades of the blower are accommodated within the central recess portion.

* * * * *